(12) United States Patent
Mullee

(10) Patent No.: US 6,509,141 B2
(45) Date of Patent: *Jan. 21, 2003

(54) REMOVAL OF PHOTORESIST AND PHOTORESIST RESIDUE FROM SEMICONDUCTORS USING SUPERCRITICAL CARBON DIOXIDE PROCESS

(75) Inventor: William H. Mullee, Portland, OR (US)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/389,788

(22) Filed: Sep. 3, 1999

(65) Prior Publication Data

US 2002/0048731 A1 Apr. 25, 2002

Related U.S. Application Data

(63) Continuation of application No. 09/085,391, filed on May 27, 1998, now Pat. No. 6,306,564.
(60) Provisional application No. 60/047,739, filed on May 27, 1997.

(51) Int. Cl.[7] ................................................ G03F 7/42
(52) U.S. Cl. ........................... 430/329; 430/330; 134/1; 134/1.3
(58) Field of Search ................................ 430/329, 330; 134/1, 1.3

(56) References Cited

U.S. PATENT DOCUMENTS

| | | | |
|---|---|---|---|
| 2,617,719 A | 11/1952 | Stewart | ............ 23/312 |
| 3,890,176 A | 6/1975 | Bolon | ............ 156/2 |
| 3,900,551 A | 8/1975 | Bardoncelli et al. | ............ 423/9 |

(List continued on next page.)

FOREIGN PATENT DOCUMENTS

| | | |
|---|---|---|
| EP | 0 283 740 A2 | 9/1988 |
| EP | 0 391 035 | 10/1990 |
| EP | 0 518 653 B1 | 12/1992 |

(List continued on next page.)

OTHER PUBLICATIONS

Takahashi, D., "Los Alomos Lab finds way to cut chip toxic waste," Wall Street Journal, Jun. 22, 1998.

Supercritical $CO_2$ process offers less mess from semiconductor plants, Chemical Engineering Magazine, pp 27 & 29, Jul. 1998.

Sun, Y.P. et al., "Preparation of polymer–protected semiconductor nanoparticles through the rapid expansion of supercritical fluid solution," Chemical Physics Letters, pp 585–588, May, 22, 1998.

(List continued on next page.)

Primary Examiner—Kathleen Duda
(74) Attorney, Agent, or Firm—Haverstock & Owens LLP

(57) ABSTRACT

A method of removing a photoresist or a photoresist residue from a semiconductor substrate is disclosed. The semiconductor substrate with the photoresist or the photoresist residue on a surface of the semiconductor substrate is placed within a pressure chamber. The pressure chamber is then pressurized. Supercritical carbon dioxide and a stripper chemical are introduced to the pressure chamber. The supercritical carbon dioxide and the stripper chemical are maintained in contact with the photoresist or the photoresist residue until the photoresist or the photoresist residue is removed from the semiconductor substrate. The pressure chamber is then flushed and vented.

24 Claims, 1 Drawing Sheet

U.S. PATENT DOCUMENTS

| | | | | |
|---|---|---|---|---|
| 4,029,517 | A | 6/1977 | Rand | 134/11 |
| 4,091,643 | A | 5/1978 | Zucchini | 68/18 |
| 4,219,333 | A | 8/1980 | Harris | 8/137 |
| 4,341,592 | A | 7/1982 | Shortes et al. | 156/643 |
| 4,474,199 | A | 10/1984 | Blaudszun | 134/105 |
| 4,475,993 | A | 10/1984 | Blander et al. | 204/64 T |
| 4,601,181 | A | 7/1986 | Privat | 68/18 |
| 4,693,777 | A | 9/1987 | Hazano et al. | 156/345 |
| 4,749,440 | A | 6/1988 | Blackwood et al. | 156/646 |
| 4,788,043 | A | 11/1988 | Kagiyama et al. | 422/292 |
| 4,838,476 | A | 6/1989 | Rahn | 228/180.1 |
| 4,865,061 | A | 9/1989 | Fowler et al. | 134/108 |
| 4,877,530 | A | 10/1989 | Moses | 210/511 |
| 4,879,004 | A | 11/1989 | Oesch et al. | 203/89 |
| 4,923,828 | A | 5/1990 | Gluck et al. | 437/225 |
| 4,924,892 | A | 5/1990 | Kiba et al. | 134/123 |
| 4,933,404 | A | 6/1990 | Beckman et al. | 526/207 |
| 4,944,837 | A | 7/1990 | Nishikawa et al. | 156/646 |
| 4,960,140 | A | 10/1990 | Ishijima et al. | 134/31 |
| 4,983,223 | A | 1/1991 | Gessner | 134/25.4 |
| 5,011,542 | A | 4/1991 | Weil | 134/38 |
| 5,013,366 | A | 5/1991 | Jackson et al. | 134/1 |
| 5,068,040 | A | 11/1991 | Jackson | 210/748 |
| 5,105,556 | A | 4/1992 | Kurokawa et al. | 34/12 |
| 5,143,103 | A | 9/1992 | Basso et al. | 134/98.1 |
| 5,158,704 | A | 10/1992 | Fulton et al. | 252/309 |
| 5,174,917 | A | 12/1992 | Monzyk | 252/60 |
| 5,185,058 | A | 2/1993 | Cathey, Jr. | 156/654 |
| 5,185,296 | A | 2/1993 | Morita et al. | 437/229 |
| 5,193,560 | A | 3/1993 | Tanaka et al. | 134/56 R |
| 5,201,960 | A | 4/1993 | Starov | 134/11 |
| 5,213,619 | A | 5/1993 | Jackson et al. | 134/1 |
| 5,215,592 | A | 6/1993 | Jackson | 134/1 |
| 5,225,173 | A | 7/1993 | Wai | 423/2 |
| 5,236,602 | A | 8/1993 | Jackson | 210/748 |
| 5,237,824 | A | 8/1993 | Pawliszyn | 62/51.1 |
| 5,238,671 | A | 8/1993 | Matson et al. | 423/397 |
| 5,250,078 | A | 10/1993 | Saus et al. | 8/475 |
| 5,261,965 | A | 11/1993 | Moslehi | 134/1 |
| 5,266,205 | A | 11/1993 | Fulton et al. | 210/639 |
| 5,267,455 | A | 12/1993 | Dewees et al. | 68/5 |
| 5,269,815 | A | 12/1993 | Schlenker et al. | 8/475 |
| 5,274,129 | A | 12/1993 | Natale et al. | 549/349 |
| 5,288,333 | A | 2/1994 | Tanaka et al. | 134/31 |
| 5,290,361 | A | 3/1994 | Hayashida et al. | 134/2 |
| 5,294,261 | A | 3/1994 | McDermott et al. | 134/7 |
| 5,298,032 | A | 3/1994 | Schlenker et al. | 8/475 |
| 5,304,515 | A | 4/1994 | Morita et al. | 437/231 |
| 5,306,350 | A | 4/1994 | Hoy et al. | 134/22.14 |
| 5,312,882 | A | 5/1994 | DeSimone et al. | 526/201 |
| 5,313,965 | A | 5/1994 | Palen | 134/61 |
| 5,316,591 | A | 5/1994 | Chao et al. | 134/34 |
| 5,334,332 | A | 8/1994 | Lee | 252/548 |
| 5,334,493 | A | 8/1994 | Fujita et al. | 430/463 |
| 5,337,446 | A | 8/1994 | Smith et al. | 15/21.1 |
| 5,339,844 | A | 8/1994 | Stanford, Jr. et al. | 134/107 |
| 5,352,327 | A | 10/1994 | Witowski | 156/646 |
| 5,355,901 | A | 10/1994 | Mielnik et al. | 134/105 |
| 5,356,538 | A | 10/1994 | Wai et al. | 210/634 |
| 5,368,171 | A | 11/1994 | Jackson | 134/147 |
| 5,370,740 | A | 12/1994 | Chao et al. | 134/1 |
| 5,370,742 | A | 12/1994 | Mitchell et al. | 134/10 |
| 5,377,705 | A | 1/1995 | Smith, Jr. et al. | 134/95.3 |
| 5,401,322 | A | 3/1995 | Marshall | 134/13 |
| 5,403,621 | A | 4/1995 | Jackson et al. | 427/255.1 |
| 5,412,958 | A | 5/1995 | Iliff et al. | 68/5 |
| 5,417,768 | A | 5/1995 | Smith, Jr. et al. | 134/10 |
| 5,456,759 | A | 10/1995 | Stanford, Jr. et al. | 134/1 |
| 5,470,393 | A | 11/1995 | Fukazawa | 134/3 |
| 5,474,812 | A | 12/1995 | Truckenmuller et al. | 427/430.1 |
| 5,482,564 | A | 1/1996 | Douglas et al. | 134/18 |
| 5,486,212 | A | 1/1996 | Mitchell et al. | 8/142 |
| 5,494,526 | A | 2/1996 | Paranjpe | 134/1 |
| 5,500,081 | A | 3/1996 | Bergman | 156/646.1 |
| 5,501,761 | A | 3/1996 | Evans et al. | 156/344 |
| 5,505,219 | A | 4/1996 | Lansbery et al. | 134/105 |
| 5,509,431 | A | 4/1996 | Smith, Jr. et al. | 134/95.1 |
| 5,514,220 | A | 5/1996 | Wetmore et al. | 134/22.18 |
| 5,522,938 | A | 6/1996 | O'Brien | 134/1 |
| 5,526,834 | A | 6/1996 | Mielnik et al. | 134/105 |
| 5,533,538 | A | 7/1996 | Marshall | 134/104.4 |
| 5,547,774 | A | 8/1996 | Gimzewski et al. | 428/694 |
| 5,550,211 | A | 8/1996 | DeCrosta et al. | 528/480 |
| 5,580,846 | A | 12/1996 | Hayashida et al. | 510/175 |
| 5,589,105 | A | 12/1996 | DeSimone et al. | 252/351 |
| 5,632,847 | A | 5/1997 | Ohno et al. | 156/344 |
| 5,635,463 | A | 6/1997 | Muraoka | 510/175 |
| 5,637,151 | A | 6/1997 | Schulz | 134/2 |
| 5,641,887 | A | 6/1997 | Beckman et al. | 546/26.2 |
| 5,656,097 | A | 8/1997 | Olesen et al. | 134/1 |
| 5,665,527 | A | 9/1997 | Allen et al. | 430/325 |
| 5,669,251 | A | 9/1997 | Townsend et al. | 68/58 |
| 5,676,705 | A | 10/1997 | Jureller et al. | 8/142 |
| 5,679,169 | A | 10/1997 | Gonzales et al. | 134/1.3 |
| 5,679,171 | A | 10/1997 | Saga et al. | 134/3 |
| 5,683,473 | A | 11/1997 | Jureller et al. | 8/142 |
| 5,683,977 | A | 11/1997 | Jureller et al. | 510/286 |
| 5,688,879 | A | 11/1997 | DeSimone | 526/89 |
| 5,700,379 | A | 12/1997 | Biebl | 216/2 |
| 5,726,211 | A | 3/1998 | Hedrick et al. | 521/61 |
| 5,739,223 | A | 4/1998 | DeSimone | 526/89 |
| 5,783,082 | A | 7/1998 | DeSimone et al. | 210/634 |
| 5,798,438 | A | 8/1998 | Sawan et al. | 528/483 |
| 5,804,607 | A | 9/1998 | Hedrick et al. | 521/64 |
| 5,866,005 | A | 2/1999 | DeSimone et al. | 210/634 |
| 5,868,856 | A | 2/1999 | Douglas et al. | 134/2 |
| 5,868,862 | A | 2/1999 | Douglas et al. | 134/26 |
| 5,872,257 | A | 2/1999 | Beckman et al. | 546/336 |
| 5,873,948 | A | 2/1999 | Kim | 134/19 |
| 5,881,577 | A | 3/1999 | Sauer et al. | 68/5 |
| 5,908,510 | A | 6/1999 | McCullough et al. | 134/2 |
| 5,944,996 | A | 8/1999 | DeSimone et al. | 210/634 |
| 5,976,264 | A | 11/1999 | McCullough et al. | 134/2 |
| 5,980,648 | A | 11/1999 | Adler | 134/34 |
| 6,017,820 | A | 1/2000 | Ting et al. | 438/689 |
| 6,024,801 | A | 2/2000 | Wallace et al. | 134/1 |

FOREIGN PATENT DOCUMENTS

| | | |
|---|---|---|
| EP | 0 536752 A2 | 4/1993 |
| EP | 0 572 913 A1 | 12/1993 |
| EP | 0 620 270 A3 | 10/1994 |
| EP | 0 711 864 B1 | 5/1996 |
| EP | 0 726 099 A2 | 8/1996 |
| EP | 0 836 895 A2 | 4/1998 ............ B08B/7/00 |
| JP | 60-192333 | 9/1985 ............ H01L/21/30 |
| JP | 1045131 | 2/1989 |
| JP | 7142333 | 6/1995 |
| JP | 727711 | 2/1996 |
| JP | 8222508 | 8/1996 |
| WO | WO 90/06189 | 6/1990 |
| WO | WO 90/13675 | 11/1990 |
| WO | WO 93/14255 | 7/1993 |
| WO | WO 93/14259 | 7/1993 |
| WO | WO 93/20116 | 10/1993 |
| WO | WO 96/27704 | 9/1996 ............ D06L/1/00 |
| WO | WO 99/49998 | 10/1999 ............ B08B/5/00 |

OTHER PUBLICATIONS

Jackson, K. et al., "Surfactants and Microemulsions in Supercritical Fluids" in "Supercritical Fluid Cleaning," Noyes Publications, Westwood, NJ, pp 87–120, Spring 1998.

Bakker, G.L. et al., "Surface Cleaning and Carbonaceous Film Removal Using High Pressure, High Temperature Water, and Water/$CO_2$ Mixtures," J. Electrochem. Soc, vol. 145, No. 1, pp 284–291, Jan. 98.

Ober, C.K. et al., "Imaging polymers with supercritical carbon dioxide," Advanced Materials, vol. 9, No. 13, pp 1039–1043, Nov. 3 1997.

Russick, E.M. et al., "Supercritical carbon dioxide extraction of solvent from micromachined structures," Supercritital Fluids—Extraction and Pollution Prevention, ACS Symposium Series, vol. 670, pp 255–269, Oct. 21, 1997.

Dahmen, N. et al., "Supercritical fluid extraction of grinding and metal cutting waste contaminated with oils," Supercritical Fluids—Extraction and Pollution Prevention, ACS Symposium Series, vol. 670, pp 270–279 Oct. 21, 1997.

Wai, C.M., "Supercritical fluid extraction: metals as complexes," J. Chromatography A, vol. 785, pp 369–383, Oct. 17, 1997.

Xu, C. et al., Submicron–sized spherical yttrium oxide based phosphors prepared by supercritical $CO_2$–assisted aerosolization and pyrolysis, Appl. Phys. Lett., vol. 71, No. 12, Sep. 22, 1997.

Tomioka, Y. et al., "Decomposition of tetramethylammonium (TMA) in a positive photoresist developer by supercritical water," Abstracts of Papers 214th ACS Natl Meeting, American Chemical Society, Abstract No. 108, Sep. 7, 1997.

Klein, H. et al., "Cyclic organic carbonates serve as solvents and reactive diluents," Coatings World, pp 38–40, May 1997.

Buhler, J. et al., Liner array of complementary metal oxide semiconductor double–pass metal micromirrors, Opt. Eng., vol. 36, No. 5, pp 1391–1398, May 1997.

Jo, M.H. et al., Evaluation of $SiO_2$ aerogel thin film with ultra low dielectric constant as an intermetal dielectric, Microelectronic Engineering, vol. 33, pp 343–348, Jan. 1997.

McClain, J.B. et al., "Design of nonionic surfactants for supercritical carbon dioxide," Science, vol. 27, Dec. 20, 1996.

Znaidi, L. et al., "Batch and semi–continuous synthesis of magnesium oxide powders from hydrolysis and supercritical treatment of Mg(OCH$_3$)$_2$," Materials Research Bulletin, vol. 31, No. 12, pp 1527–1535, Dec. 1996.

Tadros, M.E., "Synthesis of titanium dioxide particles in supercritical CO$_2$," J. Supercritical Fluids, vol. 9, No. 3, pp 172–176, Sep. 1996.

Courtecuisse, V.G. et al., "Kinetics of the titanium isopropoxide decomposition in supercritical isopropyl alcohol," Ind. Eng. Chem. Res., vol. 35, No. 8, pp 2539–2545, Aug. 1996.

Gabor, A. et al., "Block and random copolymer resists designed for 193 nm lithography and environmentally friendly supercritical $CO_2$ development," Dept. Mat. Sci. & Eng. Cornell Univ., SPIE, vol. 2724, pp 410–417, Jun. 1996.

Schimek, G.L. et al., "Supercricital ammonium synthesis and characterization of four new alkali metal silver antimony sulfides . . . ," J. Solid State Chemistry, vol. 123, pp 277–284, May 1996.

Gallagher–Wetmore, P. et al., "Supercritical fluid processing: Opportunities for new resist materials and processes," IBM research Division, SPIE, vol. 2725, pp 289–299, Apr. 1996.

Papathomas, K.I. et al., "Debonding of photoresists by organic solvents," J. Applied Polymer Science, vol. 59, pp 2029–2037, Mar. 28, 1996.

Watkins, J.J. et al., "Polymer / metal nanocomposite synthesis in supercritical CO$_2$," Chemistry of Materials, vol. 7, No. 11, Nov. 1995.

Gloyna, E.F. et al., "Supercritical water oxidation research and development update," Environmental Progress, vol. 14, No. 3, pp 182–192, Aug. 1995.

Gallagher–Wetmore, P. et al., Supercritical fluid processing: A new dry technique for photoresist developing, IBM Research Division, SPIE, vol. 2438, pp694–708, Jun. 1995.

Gabor, A.H. et al., "Silicon–containing block copolymer resist materials," Microelectronics Technology—Polymers for Advanced Imaging and Packaging, ACS Symposium Series, vol. 614, pp 281–298, Apr. 1995.

Tsiartas, P.C. et al., "Effect of molecular weight distribution on the dissolution properties of novolac blends," SPIE, vol. 2438, pp 261–271, 1995.

Allen, R.D. et al., "Performance properties of near–monodisperse novolak resins," SPIE, vol. 2438, pp 250–260, 1995.

Wood, P.T. et al., "Synthesis of new channeled structures in supercritical amines . . . ," Inorg. Chem., vol. 33, pp 1556–1558, 1994.

Jerome, J.E. et al., "Synthesis of new low–dimensional quaternary compounds . . . ," Inorg. Chem., vol. 33, pp 1733–1734, 1994.

McHardy, J. et al., "Progress in supercritical CO$_2$ cleaning," Sampe Jour., vol. 29, No. 5, pp 20–27, Sep. 1993.

Purtell, R. et al., "Precision parts cleaning using supercritical fluids," J. Vac. Sci. Technol. A, vol. 11, No. 4, Jul. 1993.

Bok, E. et al., "Supercritical fluids for single wafer cleaning," Solid State Technology, pp 117–120, Jun. 1992.

Adschiri, T. et al., "Rapid and continuous hydrothermal crystallization of metal oxide particles in supercritical water," J. Am. Ceram. Soc., vol. 75, No. 4, pp 1019–1022, 1992.

Hansen, B.N. et al., "Supercritical fluid transport—chemical deposition of films," Chem. Mater., vol. 4, No. 4, pp 749–752, 1992.

Page, S.H. et al., "Predictability and effect of phase behavior of CO$_2$/ propylene carbonate in supercritical fluid chromatography," J. Microl. Sep, vol. 3, No. 4, pp 355–369, 1991.

Brokamp, T. et al., "Synthese und Kristallstruktur eines gemischtvalenten Lithium—Tantalnirids Li$_2$Ta$_3$N$_5$," J. Alloys and Compounds, vol. 176, pp 47–60, 1991, abstract in English.

Hybertson, B.M. et al., "Deposition of palladium films by a novel supercritical fluid transport–chemical deposition process," Mat. Res. Bull., vol. 26, pp 1127–1133, 1991.

Ziger, D.H. et al., "Compressed fluid technology: Application to RIE–developed resists," AIChE Jour., vol. 33, No. 10, pp 1585–1591, Oct. 1987.

Matson, D.W. et al., "Rapid expansion of supercritical fluid solutions: Solute formation of powders, thin films, and fibers," Ind. Eng. Chem. Res., vol. 26, No. 11, pp 2298–2306, 1987.

Tolley, W.K. et al., "Stripping organics from metal and mineral surfaces using supercritical fluids," Separation Science and Technology, vol. 22, pp 1087–1101, 1987.

"Final report on the safety assessment of propylene carbonate," J. American College of Toxicology, vol. 6, No. 1, pp. 23–51.

Guan, Z. et al., "Fluorocarbon–Based Heterophase Polymeric Materials, 1. Block Copolymer Surfactants for Carbon Dioxide Applications," Macromolecules, vol. 27, 1994, pp 5527–5532.

International Journal of Environmentally Conscious Design & Manufacturing, vol. 2, No. 1, 1993, p. 83.

Journal of the American Ceramic Society, vol. 72, No. 6, pp. 872–874.

Ziger, D.H. et al., "Compressed Fluid Technology: Application to RIE Developed Resists," AIChE Journal, vol. 33, No. 10, Oct. 1987, pp 1585–1591.

Kirk–Othmer, "Encyclopedia of Chemical Terminology," 3rd ed., Supplement Volume, "Alcohol Fuels to Toxicology," 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p 14.

"A Comparison of Chilled DI Water/Ozone and Co2–Based Supercritical Fluids as Replacements for Photoresist–Stripping Solvents" by J.B. Rubin et al., Physical Organic Chemistry Group (CST–12) Chemical Science & Technology Division Los Alamos National Laboratory, Los Alamos, New Mexico.

REMOVAL OF PHOTORESIST AND PHOTORESIST RESIDUE FROM SEMICONDUCTORS USING SUPERCRITICAL CARBON DIOXIDE PROCESS

RELATED APPLICATIONS

This application is a continuation of co-pending U.S. application Ser. No. 09/085,391, filed May 27, 1998 now U.S. Pat. No. 6,306,564 which claims priority from U.S. Provisional Application No. 60/047,739, filed May 27, 1997.

FIELD OF THE INVENTION

The present invention relates to the field of removal of photoresist and photoresist residue from semiconductor wafers. More particularly, the present invention relates to the field of removal of photoresist and photoresist residue from semiconductor wafers using supercritical carbon dioxide.

BACKGROUND OF THE INVENTION

Manufacture of semiconductor devices requires application and subsequent removal of a photoresist chemical from a surface of a semiconductor wafer. The removal of the photoresist chemical, commonly known as stripping, may be immediately preceded by a plasma ashing, etching, or other semiconductor manufacturing step. These steps can degrade or carbonize the photoresist chemical and leave a photoresist residue that difficult to remove by current stripping methods. The current stripping methods require that the wafers be dipped into baths of commericially available chemical mixtures known as strippers. The baths may employ heat or ultrasonic augmentation. Typically, the baths employ immersion times of twenty to thirty minutes to achieve complete removal of photoresist or photoresist residue from the wafer surface.

What is needed is a more effective method of removing photoresist.

What is needed is a more effective method of removing photoresist residue.

What is needed is a more effective method of removing photoresist.

What is needed is a more effective method of removing photoresist residue.

SUMMARY OF THE INVENTION

The present invention is a method of removing a photoresist or a photoresist residue from a semicondutor substrate. The semiconductor substrate with the photoresist or the photoresist residue on a surface of the semiconductor substrate is placed within a pressure chamber. The pressure chamber is then pressurized. Supercritical carbon dioxide and a stripper chemical are introduced into the pressure chamber. The supercritical carbon dioxide and the stripper chemical are maintained in contact with the photoresist or the photoresist residue until the photoresist or the photoresist residue is removed from the semiconductor substrate. The pressure chamber is then flushed and vented.

DETAILED DESCRIPTION OF THE PREFERRED EMBODIMENT

Figure 1:
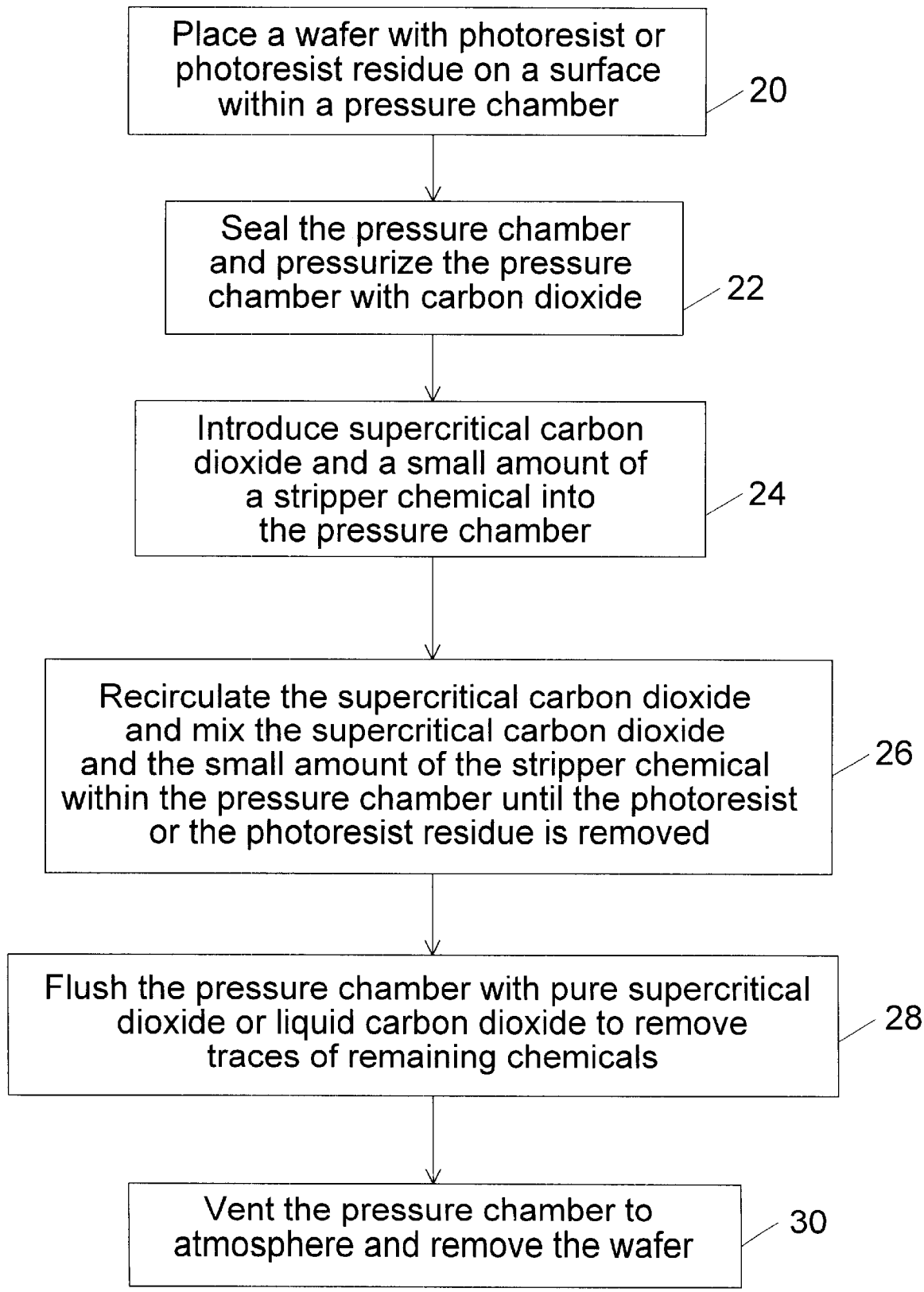
FIG. 1 is a flow chart illustrating the steps of a method of the present invention.

The preferred embodiment of the present invention utilizes the high solvency and cleaning characteristics of supercritical carbon dioxide to assist in the stripping process of photoresist or photoresist residue. Only a small fraction of a stripper chemical is required to affect the stripping process compared to the prior art. In the preferred embodiment of the present invention, the supercritical carbon dioxide carries the stripper chemical onto the wafer to be cleaned and is then recycled back to a carbon dioxide compressor for reuse. The stripper chemical is typical of chemicals found in commercially available stripper products. The high degree of solvency and solubilizing ability provided by the supercritical carbon dioxide enhances the removel of the photoresist or the photoresist residue. The high solubilizing ability provided by the supercritical carbon dioxide is well known to science and has been exploited in numerous other applications, for example in cleaning of metal parts.

Solvency of the supercritical carbon dioxide increases with pressure. The supercritical carbon dioxide effectively carries a small amount of the stripper chemical onto submicron surface features of modern semiconductor devices because diffusivity and viscosity of the supercritical carbon dioxide is similar to a gas phase and because density of the supercritical carbon dioxide is nearly equal to liquid phase. The supercritical carbon dioxide also carries away the photoresist, or the phorotresist residue, and remaining stripper chemical from the surface of the wafer. Thus, it is possible to use the small amount of the stripper chemical to perform the stripping process and to also carry away remaining chemicals and residue.

The preferred embodiment of the present invention is illustrated in FIG. 1. A wafer with the photoresist of the photoresist residue is placed in a pressure chamber in a first process step 20. The pressure chamber is sealed and pressurized with carbon dioxide in a second process step 22. As pressure inside the pressure chamber increases, the carbon dioxide becomes liquid and then reaches supercritical temperature and supercritical pressure. Typical process conditions range from 20 to 70° C. and from 1,050 to 6,000 psig.

When desired process conditions are reached, the small amount of the stripper chemical is introduced into a supercritical carbon dioxide stream and thus added into the pressure chamber in a third process step 24. A volume ratio of the stripper chemical to the supercritical carbon dioxide is preferably 0.1 to 15.0 v/v %. The stripper chemical is preferably selected from the group consisting N-methyl pyrrolidone, monoethanol amine, di-isopropyl amine, tri-isopropyl amine, diglycol amine, hydroxyl amine, catechol, and a mixture thereof. Monoethanol amine, hydroxyl amine, and catechol have only marginal utility.

Processing continues with recirculation of the supercritical carbon dioxide and with mixing of the supercritical carbon dioxide and stripper chemical within the pressure chamber in a fourth process step 26. The fourth process step 28 continues until the photoresist or the photoresist residue is removed from the wafer, typically from 3 to 15 minutes. The pressure chamber is the flushed with pure supercritical carbon dioxide or liquid carbon dioxide to remove traces of the remaining chemicals in a fifth process step 28. Finally, the pressure chamber is vented to atmosphere and the wafer is removed in a sixth process step 30. An optional final process step rinses the wafer with deionized or ultra-pure water.

Use of the supercritical carbon dioxide in combination with the small amount of the stripper chemical greatly enhances the removal of the photoresist, or the photoresist residue, from surfaces of semiconductor devices. The amount of the stripper chemical required to effectively remove the photoresist or the photoresist residue from the wafer is reduced significantly by using supercritical carbon dioxide compared to the prior art wet chemical stripping methods. An amount of hazardous chemical waste generated as a result of using the supercritical carbon dioxide and the stripper chemical is significantly less than the prior art wet chemical stripping methods. The supercritical carbon dioxide and the stripper chemical eliminates a need for the prior art wet chemical stripping methods along with using large amounts of chemicals and expensive wet baths. Also, the supercritical carbon dioxide and the stripper chemical remove traces of organic contamination form the wafer.

In an alternative embodiment of the present invention, a small amount of an organic solvent is added to the supercritical carbon dioxide and the stripper chemical. The organic solvent is preferably selected from the group consisting of alcohols, ethers, and glycols. The organic solvent enhances removal of the traces of the organic contamination from the wafer.

It will be readily apparent to one skilled in the art that other various modifications may be made to the preferred embodiment without departing from the spirit and scope of the invention as defined by the appended claims.

What is claimed is:

1. A method of removing a photoresist from a surface of a semiconductor substrate comprising the steps of:
   a. placing the semiconductor substrate with the photoresist on the surface of the semiconductor substrate within a pressure chamber;
   b. pressurizing the pressure chamber;
   c. introducing supercritical carbon dioxide and a stripper chemical into the pressure chamber;
   d. mixing the supercritical carbon dioxide and the stripper chemical within the pressure chamber until the photoresist is removed from the semiconductor substrate; and
   e. flushing the pressure chamber.

2. The method of claim 1 wherein the stripper chemical is selected from the group consisting of N-methyl pyrrolidone, di-isopropyl amine, tri-isopropyl amine, diglycol amine, and a mixture thereof.

3. The method of claim 1 wherein a volume ratio of the stripper chemical to the supercritical carbon dioxide is within the range and including 0.1 to 15.0 v/v %.

4. The method of claim 1 further comprising the step of adding an organic solvent to the supercritical carbon dioxide and the stripper chemical within the pressure chamber.

5. The method of claim 4 wherein the organic solvent is chosen from the group consisting of alcohols, ethers, and glycols.

6. A method of removing a photoresist residue from a surface of a semiconductor substrate comprising the steps of:
   a. placing the semiconductor substrate with the photoresist residue on the surface of the semiconductor substrate within a pressure chamber;
   b. pressurizing the pressure chamber;
   c. introducing supercritical carbon dioxide and an stripper chemical into the pressure chamber;
   d. mixing the supercritical carbon dioxide and the stripper chemical within the pressure chamber until the photoresist residue is removed from the semiconductor substrate; and
   e. flushing the pressure chamber.

7. The method of claim 6 wherein the stripper chemical is selected from the group consisting of N-methyl pyrrolidone, di-isopropyl amine, tri-isopropyl amine, diglycol amine, and a mixture thereof.

8. The method of claim 6 wherein a volume ratio of the stripper chemical to the supercritical carbon dioxide is within the range and including 0.1 to 15.0 v/v %.

9. The method of claim 6 further comprising the step of adding an organic solvent to the supercritical carbon dioxide and the stripper chemical within the pressure chamber.

10. The method of claim 9 wherein the organic solvent is chosen from the group consisting of alcohols, ethers, and glycols.

11. The method of claim 6 wherein the photoresist residue is formed in a plasma ashing process.

12. The method of claim 6 wherein the photoresist residue is formed in a plasma etching process.

13. A method of removing a photoresist from a surface of a semiconductor substrate comprising the steps of:
   a. introducing supercritical carbon dioxide and a stripper chemical to the semiconductor substrate with the photoresist on the surface of the semiconductor substrate;
   b. maintaining the supercritical carbon dioxide and the stripper chemical in contact with the semiconductor substrate until the photoresist is removed; and
   c. removing the supercritical carbon dioxide and the stripper chemical from contact with the semiconductor substrate.

14. The method of claim 13 wherein the stripper chemical is selected from the group consisting of N-methyl pyrrolidone, di-isopropyl amine, tri-isopropyl amine, diglycol amine, and a mixture thereof.

15. The method of claim 13 wherein a volume ratio of the stripper chemical to the supercritical carbon dioxide is within the range and including 0.1 to 15.0 v/v %.

16. The method of claim 13 further comprising the step of adding an organic solvent to the supercritical carbon dioxide and the stripper chemical within the pressure chamber.

17. The method of claim 16 wherein the organic solvent is chosen from the group consisting of alcohols, ethers, and glycols.

18. A method of removing a photoresist residue from a surface of a semiconductor substrate comprising the steps of:
   a. introducing supercritical carbon dioxide and a stripper chemical to the semiconductor substrate with the photoresist residue thereon;
   b. maintaining the supercritical carbon dioxide and the stripper chemical in contact with the semiconductor substrate until the photoresist residue is removed; and
   c. removing the supercritical carbon dioxide and the stripper chemical from contact with the semiconductor substrate.

19. The method of claim 18 wherein the stripper chemical is selected from the group consisting of N-methyl pyrrolidone, di-isopropyl amine, tri-isopropyl amine, diglycol amine, and a mixture thereof.

20. The method of claim 18 wherein a volume ratio of the stripper chemical to the supercritical carbon dioxide is within the range and including 0.1 to 15.0 v/v %.

21. The method of claim 18 further comprising the step of adding an organic solvent to the supercritical carbon dioxide and the stripper chemical within the pressure chamber.

22. The method of claim 21 wherein the organic solvent is chosen from the group consisting of alcohols, ethers, and glycols.

23. The method of claim 18 wherein the photoresist residue is formed in a plasma ashing process.

24. The method of claim 18 wherein the photoresist residue is formed in a plasma etching process.

* * * * *

UNITED STATES PATENT AND TRADEMARK OFFICE
CERTIFICATE OF CORRECTION

PATENT NO.    : 6,509,141 B2
DATED         : January 21, 2003
INVENTOR(S)   : William H. Mullee It is certified that error appears in the above-identified patent and that said Letters Patent is hereby corrected as shown below:

The title page should be deleted to appear as per attached title page.

The sheet of drawing consisting of figure 1 should be deleted to appear as per attached sheet.

(12) United States Patent
Mullee

(10) Patent No.: US 6,509,141 B2
(45) Date of Patent: *Jan. 21, 2003

(54) REMOVAL OF PHOTORESIST AND PHOTORESIST RESIDUE FROM SEMICONDUCTORS USING SUPERCRITICAL CARBON DIOXIDE PROCESS

(75) Inventor: William H. Mullee, Portland, OR (US)

(73) Assignee: Tokyo Electron Limited, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/389,788

(22) Filed: Sep. 3, 1999

(65) Prior Publication Data

US 2002/0048731 A1 Apr. 25, 2002

Related U.S. Application Data

(63) Continuation of application No. 09/085,391, filed on May 27, 1998, now Pat. No. 6,306,564.
(60) Provisional application No. 60/047,739, filed on May 27, 1997.

(51) Int. Cl.[7] .................................................. G03F 7/42
(52) U.S. Cl. ........................... 430/329; 430/330; 134/1; 134/1.3
(58) Field of Search ............................ 430/329, 330; 134/1, 1.3

(56) References Cited

U.S. PATENT DOCUMENTS 2,617,719 A 11/1952 Stewart ........................ 23/312
3,890,176 A 6/1975 Bolon ............................ 156/2
3,900,551 A 8/1975 Bardoncelli et al. ............ 423/9

(List continued on next page.)

FOREIGN PATENT DOCUMENTS

| EP | 0 283 740 A2 | 9/1988 |
| EP | 0 391 035 | 10/1990 |
| EP | 0 518 653 B1 | 12/1992 |

(List continued on next page.)

OTHER PUBLICATIONS

Takahashi, D., "Los Alomos Lab finds way to cut chip toxic waste," Wall Street Journal, Jun. 22, 1998.

Supercritical $CO_2$ process offers less mess from semiconductor plants, Chemical Engineering Magazine, pp 27 & 29, Jul. 1998.

Sun, Y.P. et al., "Preparation of polymer-protected semiconductor nanoparticles through the rapid expansion of supercritical fluid solution," Chemical Physics Letters, pp 585–588, May, 22, 1998.

(List continued on next page.)

Primary Examiner—Kathleen Duda
(74) Attorney, Agent, or Firm—Haverstock & Owens LLP

(57) ABSTRACT

A method of removing a photoresist or a photoresist residue from a semiconductor substrate is disclosed. The semiconductor substrate with the photoresist or the photoresist residue on a surface of the semiconductor substrate is placed within a pressure chamber. The pressure chamber is then pressurized. Supercritical carbon dioxide and a stripper chemical are introduced to the pressure chamber. The supercritical carbon dioxide and the stripper chemical are maintained in contact with the photoresist or the photoresist residue until the photoresist or the photoresist residue is removed from the semiconductor substrate. The pressure chamber is then flushed and vented.

24 Claims, 1 Drawing Sheet

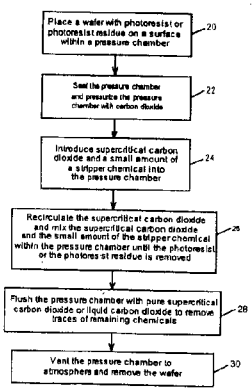

UNITED STATES PATENT AND TRADEMARK OFFICE
CERTIFICATE OF CORRECTION

PATENT NO. : 6,509,141 B2
DATED : January 21, 2003
INVENTOR(S) : William H. Mullee It is certified that error appears in the above-identified patent and that said Letters Patent is hereby corrected as shown below:

Title page,
Item [57], ABSTRACT,
Line 7, please delete "to" and insert -- into --.

Column 1,
Line 28, please delete "that difficult" and insert -- that is difficult --.
Lines 41-44, please delete "What is needed is a more effective method of removing photoresist. What is needed is a more effective method of removing photoresist residue."

Column 2,
Line 22, please delete "to liquid" and insert -- to a liquid --.
Line 24, please delete "and remaining" and insert -- and the remaining --.
Line 30, please delete "of" and insert -- or --.
Line 44, please delete "consisting N-methyl" and insert -- consisting of N-methyl --.
Line 53, please delete "28" and insert -- 26 --.
Line 55, please delete "the" and insert -- then --.

Column 3,
Line 12, please delete "form" and insert -- from --.
Line 57, please delete "an stripper" and insert -- a stripper --.

Signed and Sealed this

Twenty-ninth Day of July, 2003

JAMES E. ROGAN
*Director of the United States Patent and Trademark Office*